United States Patent
Chiu et al.

(10) Patent No.: US 7,480,892 B2
(45) Date of Patent: Jan. 20, 2009

(54) OVERLAY MARK

(75) Inventors: Chui-fu Chiu, Taoyuan County (TW); Wen-Bin Wu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 219 days.

(21) Appl. No.: 11/513,196

(22) Filed: Aug. 31, 2006

(65) Prior Publication Data

US 2008/0034344 A1 Feb. 7, 2008

(30) Foreign Application Priority Data

Aug. 4, 2006 (TW) .............................. 95128681 A

(51) Int. Cl.
*G06F 17/50* (2006.01)
(52) U.S. Cl. .......................................... 716/21; 716/19
(58) Field of Classification Search .................... 716/21, 716/19; 430/5
See application file for complete search history.

(56) References Cited

U.S. PATENT DOCUMENTS

| | | | |
|---|---|---|---|
| 6,610,448 B2* | 8/2003 | Sato et al. ......................... 430/5 |
| 7,170,604 B2* | 1/2007 | Sezginer et al. ............. 356/400 |
| 7,180,593 B2* | 2/2007 | Lin ............................. 356/401 |
| 2003/0074639 A1* | 4/2003 | Park et al. ........................ 716/1 |
| 2005/0068515 A1* | 3/2005 | Bauch et al. ................... 355/77 |
| 2005/0193362 A1* | 9/2005 | Phan et al. ..................... 716/19 |
| 2006/0117293 A1* | 6/2006 | Smith et al. ................... 716/19 |
| 2006/0265686 A1* | 11/2006 | Ikeda et al. ................... 716/21 |
| 2007/0006116 A1* | 1/2007 | Percin et al. ................... 716/21 |
| 2008/0032205 A1* | 2/2008 | Chiu et al. ....................... 430/5 |

* cited by examiner

*Primary Examiner*—Jack Chiang
*Assistant Examiner*—Magid Y Dimyan
(74) *Attorney, Agent, or Firm*—Birch, Stewart, Kolasch & Birch, LLP

(57) ABSTRACT

An overlay mark formed on a photomask, comprising a first rectangular region, a second rectangular region, a third rectangular region, and a fourth rectangular region, each rectangular region having the same pattern configuration, a longer side of the first rectangular region and a longer side of the third rectangular region being parallel to each other, and the first and third rectangular regions have the same first pattern configuration having a first pattern element, a longer side of the second rectangular region and a longer side of the fourth rectangular region being parallel to each other, and the second and fourth rectangular regions have the same second pattern configuration having a second pattern element, the longer side of the first rectangular region being perpendicular to the longer side of the second rectangular region; wherein, the first pattern element is different from the second pattern element for allowing the second pattern configuration be chosen to align when the first pattern configuration on the substrate was damaged during process.

1 Claim, 7 Drawing Sheets

OVERLAY MARK

FIELD OF INVENTION

The present invention generally relates to an overlay mark, and more particularly, to an overlay mark used for overlaying alignment between photomasks during integrated circuit (IC) process.

BACKGROUND OF THE INVENTION

Photolithography is one of the most critical steps in IC manufacturing process. The quantity of photomask and lithography needed in the process indicates the integration complication of the IC. The improvement of lithography determines whether the IC can have a smaller feature dimension than previous generation. Exposure of photo-resist is one of the critical steps in lithography process due to its accuracy requirement. As mentioned above, the IC manufacturing process involves typically more than ten photomasks of different patterns, the alignment between the photomasks critically determines the quality of patterns transferred to the target layer and the final performance of the IC.

As well known in the arts, the step and repeat projection exposure step is to scale down for 4 to 10 times the patterns on the photomask on surface of substrate for each step, and multiple steps are repeated to complete the exposure for the entire substrate of wafer, as indicated in FIG. 1. The apparatus used for executing the exposure step is the so-called Stepper, which typically employing charge-coupled diode (CCD) camera for alignment purpose. As illustrated in FIG. 1, light source 11 typically may be the Ultra-Violet light emitted by mercury arc lamp, or other light source facilitating the same purpose. The photomask 12 has device patterns thereon, and additional overlay mark 13 positioned at the edge of the photomask 12, the alignment must be assured before each exposure is performed. As indicated, through the lens 14, the device patterns on the photomask 12 and the overlay mark 13 are transferred to the surface of the wafer 15. Compared to the actual size, the pattern on the photomask 13 is magnified, and the pattern is shrunk to actual size by lens 14 and transferred on one location of the wafer during exposure step. Since the lithography process is well known in the arts, the details of the process are not further described herein.

The well known overlay marks, such as Box-in-Box (BiB) and Advanced Imaging Metrology (AIM) are generally used for the overlaying alignment between photomasks. As indicated in FIG. 2A, a BiB overlay mark 20 according to the prior arts is provided on the photomask as having a first rectangular region 21, a second rectangular region 22, a third rectangular region 23 and a fourth rectangular region 24. The longer side of the first rectangular region 21 and the longer side of the third rectangular region 23 are parallel to each other, the longer side of the second rectangular region 22 and the longer side of the fourth rectangular region 24 are parallel to each other. The longer side of the first rectangular region 21 or the third rectangular region 23 is perpendicular to the longer side of the second rectangular region 22 or the fourth rectangular region 24. Namely, along the horizontal and vertical directions, there are two parallel and symmetrical rectangular regions respectively. Alternatively, these four regions may be independently an open region or may be connected to each other by joining tail of one region to head of the connecting region.

FIG. 2B illustrates a mark pattern 30 previously formed on the substrate after the previous process is completed. The mark pattern 30 includes a first aligned rectangular region 31a, a second aligned rectangular region 32a, a third aligned rectangular region 33a and a fourth aligned rectangular region 34a.

The alignment configuration 40 is illustrated in FIG. 2C. As mentioned above, the pattern in FIG. 2A is transferred on the photo-resist to form a first rectangular region 31b, a second rectangular region 32b, a third rectangular region 33b and a fourth rectangular region 34b. By making measurement of orientation and/or gap between the first aligned rectangular region 31a, the second aligned rectangular region 32a, the third aligned rectangular region 33a and the fourth aligned rectangular region 34a and the first rectangular region 31b, the second rectangular region 32b, the third rectangular region 33b and the fourth rectangular region 34b respectively, the alignment step is performed. When the measured orientation and/or gap meet the predetermined criterion, the patternization is successful and process continues. However, when criterion is not met, the failure photo-resist at this stage must be removed and the lithography process is repeated again until the criterion is met.

The AIM overlay mark is designed using the optical metrology and is more dense than BiB overlay mark for reducing possible inaccuracy during manufacturing process. In addition, the BiB overlay mark on the layer of wafer may be eroded after processes including etching, CMP or ion implant such that alignment procedure can not be performed accurately. In contrast, the AIM overlay mark has lesser open area lowering possibility of erosion during processes and, therefore, enhancing alignment accuracy between photomasks.

As indicated in FIG. 3A, an AIM overlay mark 50 according to the prior arts is provided on the photomask as having a first rectangular region 51, a second rectangular region 52, a third rectangular region 53 and a fourth rectangular region 54. The longer side of the first rectangular region 51 and the longer side of the third rectangular region 53 are parallel to each other, the longer side of the second rectangular region 52 and the longer side of the fourth rectangular region 54 are parallel to each other. The longer side of the first rectangular region 51 or the third rectangular region 53 is perpendicular to the longer side of the second rectangular region 52 or the fourth rectangular region 54. Namely, along the horizontal and vertical directions, there are two parallel and symmetrical rectangular regions respectively.

FIG. 3B illustrates a mark pattern 60 previously formed on the substrate after the previous process is completed. The mark pattern 60 includes a first aligned rectangular region 61a, a second aligned rectangular region 62a, a third aligned rectangular region 63a and a fourth aligned rectangular region 64a.

The alignment configuration 70 is illustrated in FIG. 3C. As mentioned above, the pattern in FIG. 3A is transferred on the photo-resist to form a first rectangular region 61b, a second rectangular region 62b, a third rectangular region 63b and a fourth rectangular region 64b. By making measurement of orientation and/or gap between the first aligned rectangular region 61a, the second aligned rectangular region 62a, the third aligned rectangular region 63a and the fourth aligned rectangular region 64a and the first rectangular region 61b, the second rectangular region 62b, the third rectangular region 63b and the fourth rectangular region 64b respectively, the alignment step is performed. When the measured orientation and/or gap meet the predetermined criterion, the patternization is successful and process continues. However, when criterion is not met, the failure photo-resist at this stage must be removed and the lithography process is repeated again until the criterion is met.

Due to continuing demand for further down-scaling of IC process, further accuracy of photomasks alignment becomes an important issue which is to be resolved by any improved overlay mark configuration such as that disclosed by this application.

SUMMARY OF THE INVENTION

In a preferably embodiment of the present invention, an overlay mark formed on a photomask, comprising a first rectangular region, a second rectangular region, a third rectangular region, and a fourth rectangular region, each rectangular region having the same pattern configuration, a longer side of the first rectangular region and a longer side of the third rectangular region being parallel to each other, and the first and third rectangular regions have the same first pattern configuration having a first pattern element, a longer side of the second rectangular region and a longer side of the fourth rectangular region being parallel to each other, and the second and fourth rectangular regions have the same second pattern configuration having a second pattern element, the longer side of the first rectangular region being perpendicular to the longer side of the second rectangular region; wherein, the first pattern element is different from the second pattern element for allowing the second pattern configuration be chosen to align when the first pattern configuration on the substrate was damaged during process.

In another preferably embodiment of the present invention, there is a photomask having an overlay mark, and the overlay mark comprises a first rectangular region, a second rectangular region, a third rectangular region, and a fourth rectangular region, each rectangular region having the same pattern configuration, a longer side of the first rectangular region and a longer side of the third rectangular region being parallel to each other, and the first and third rectangular regions have the same first pattern configuration having a first pattern element, a longer side of the second rectangular region and a longer side of the fourth rectangular region being parallel to each other, and the second and fourth rectangular regions have the same second pattern configuration having a second pattern element, the longer side of the first rectangular region being perpendicular to the longer side of the second rectangular region; wherein, the first pattern element is different from the second pattern element for allowing the second pattern configuration be chosen to align when the first pattern configuration on the substrate was damaged during process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

Figure 4:
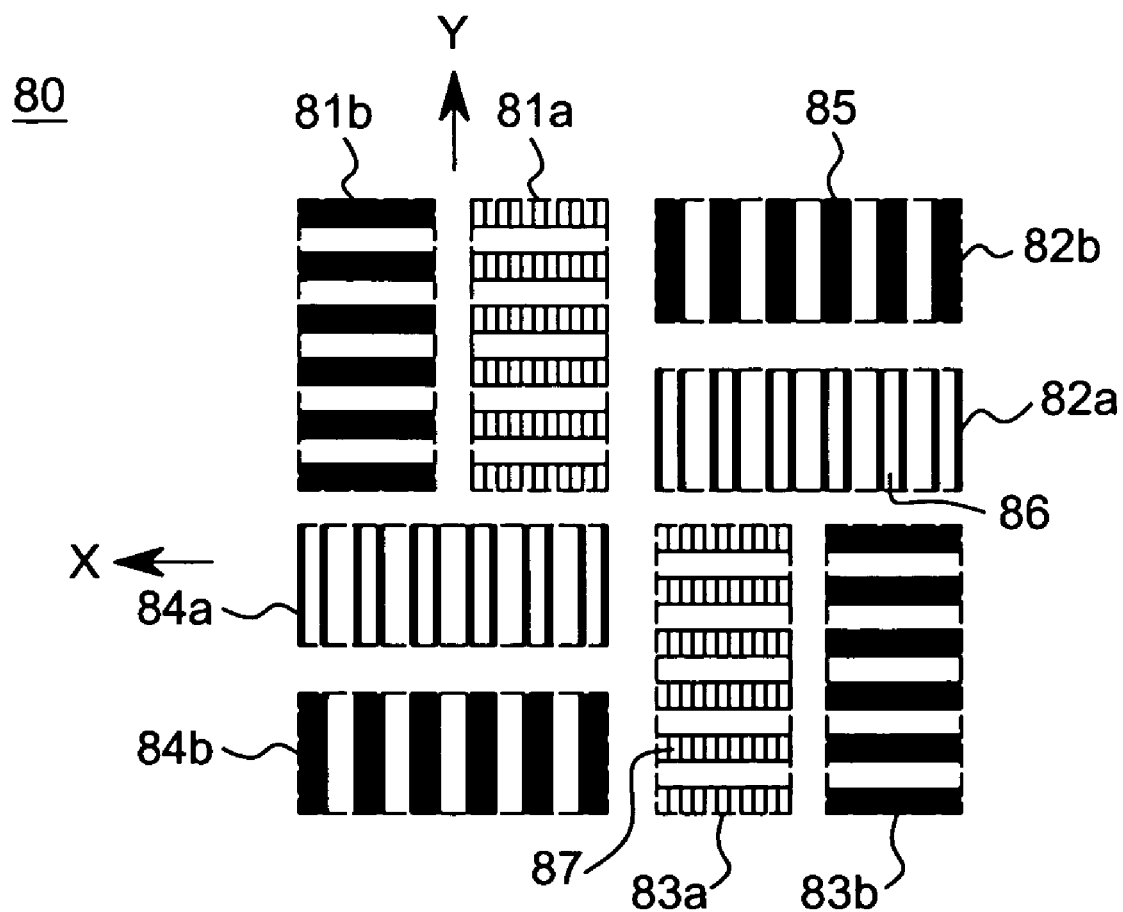
FIG. 4 illustrates an overlaying structure of AIM overlay mark patterns of the present invention.
Figure 5A:
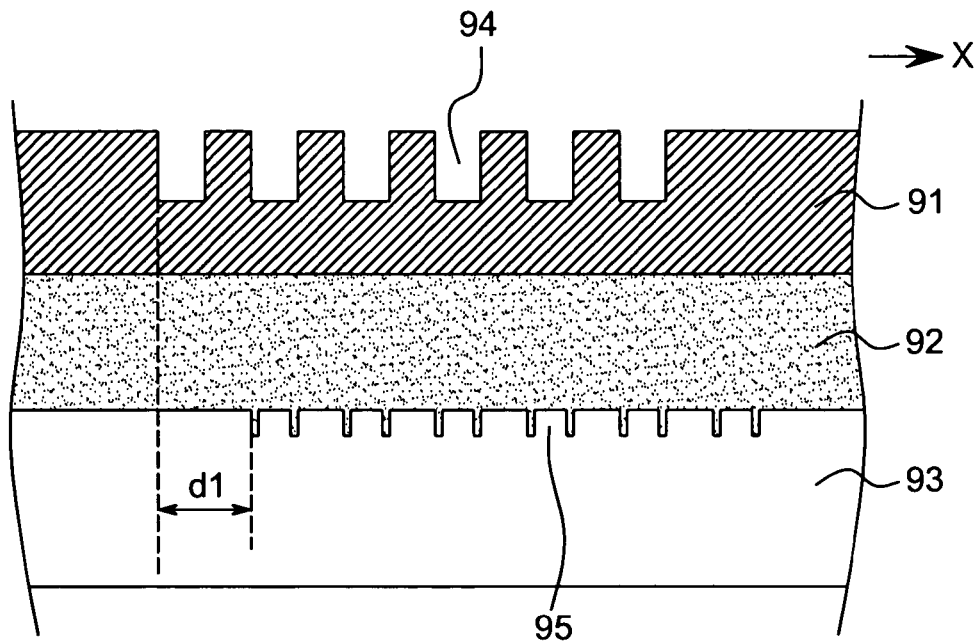
FIG. 5A illustrates a cross-section view of an overlaying structure of the present invention in x orientation.
Figure 5B:
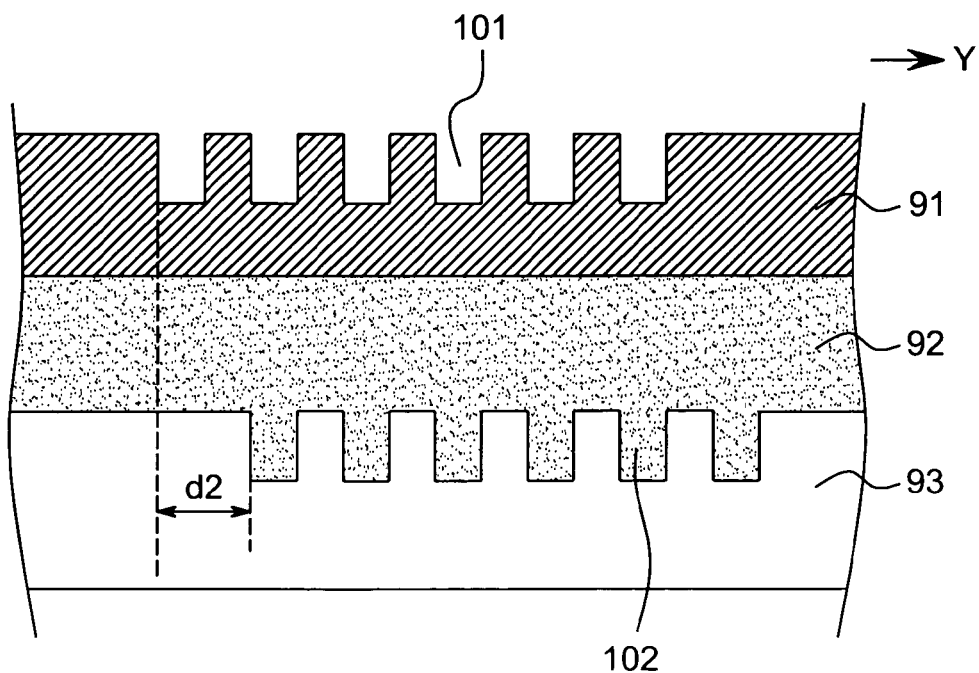
FIG. 5B illustrates a cross-section view of an overlaying structure of the present invention in y orientation.

Referring now to the drawings, and more particular to FIGS. 4-5B, there are shown exemplary embodiments of the overlay mark configuration according to the present invention.

Figure 1:
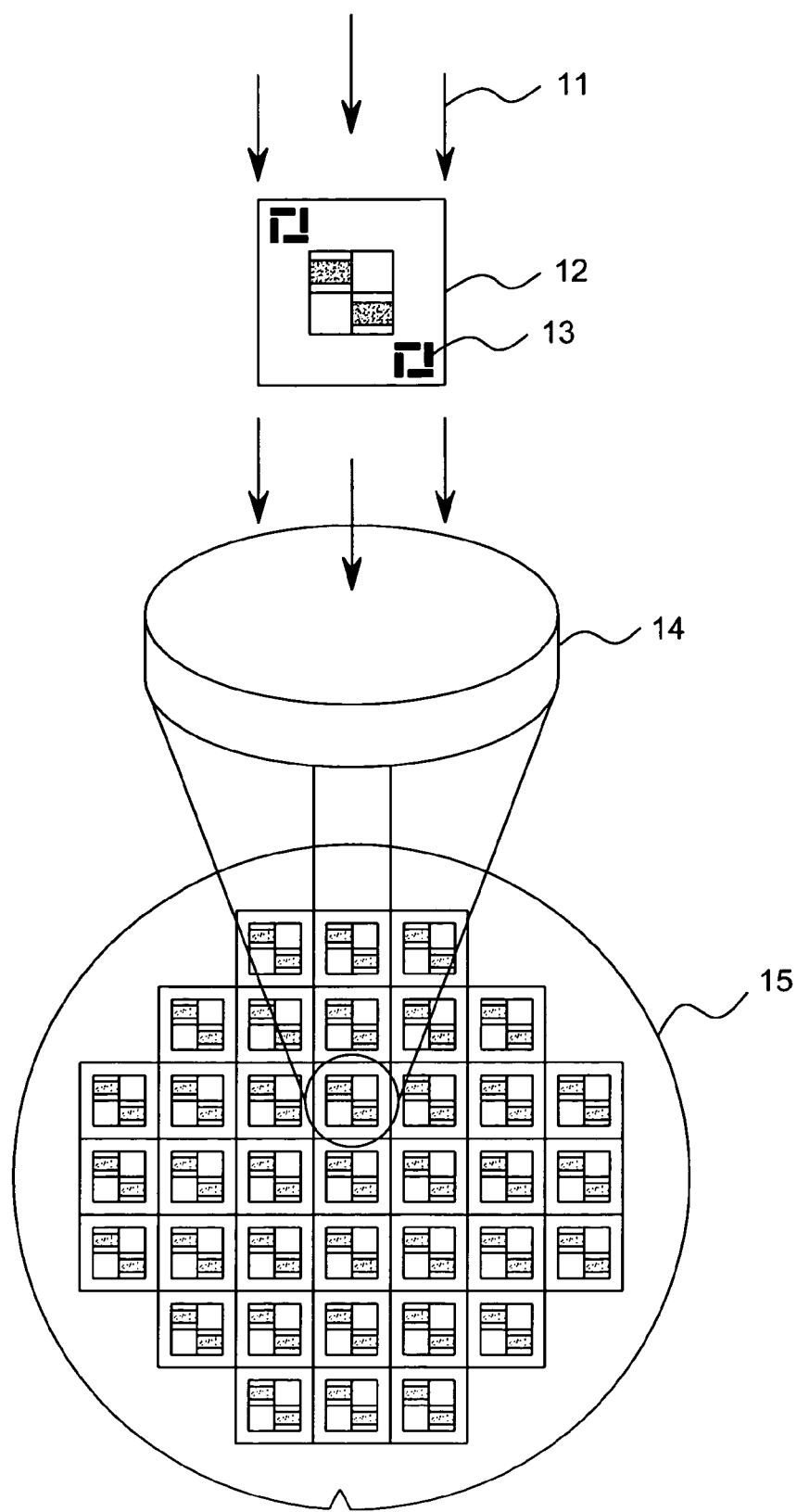
FIG. 1 illustrates a schematic drawing of step and repeat projective exposure.
Figure 2A:
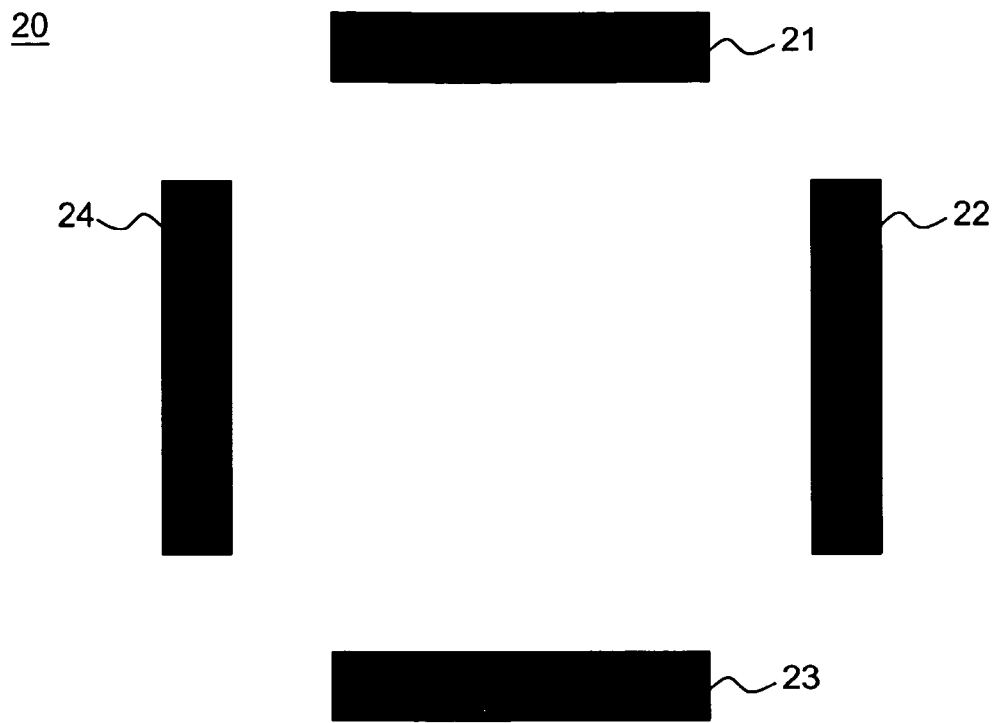
FIG. 2A illustrates a BiB overlay mark designed on a photomask as in prior technique.
Figure 2B:
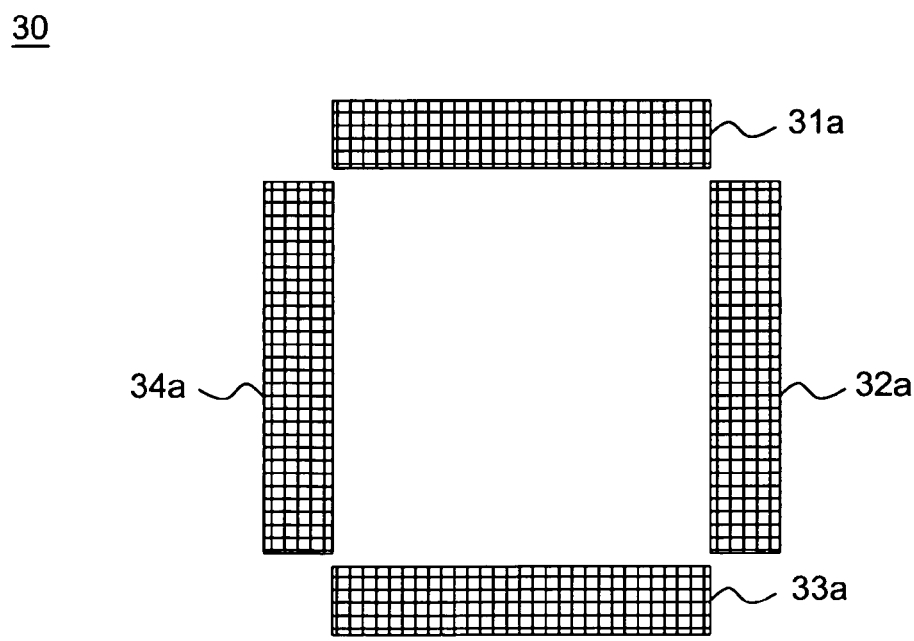
FIG. 2B illustrates a BiB aligned mark pattern formed on a substrate.
Figure 2C:
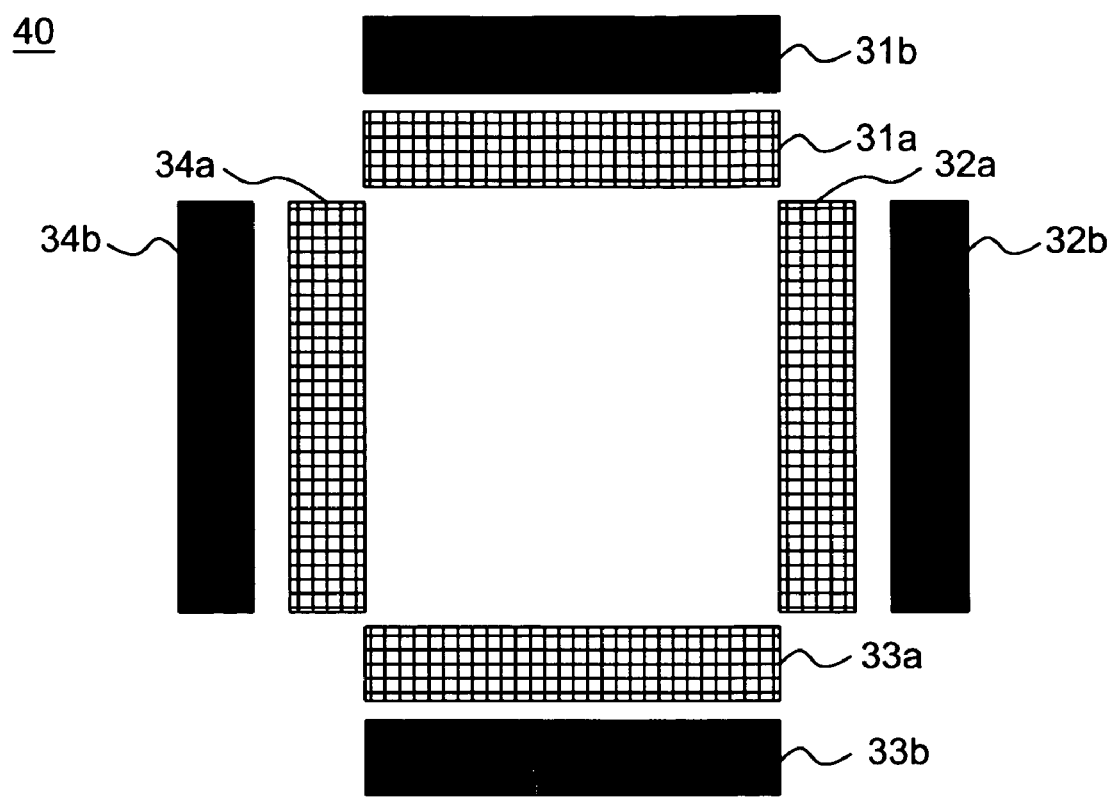
FIG. 2C illustrates an aligned structure of overlaying patterns formed by BiB overlay mark.
Figure 3A:
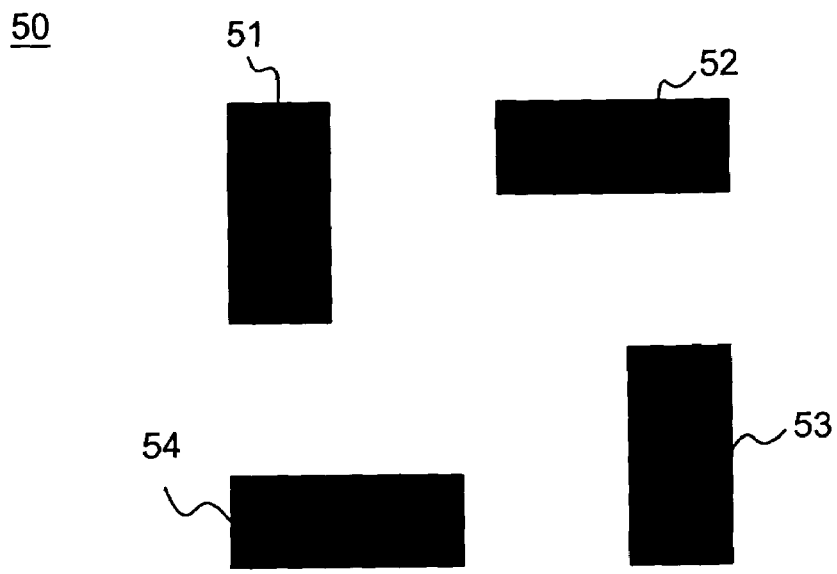
FIG. 3A illustrates a AIM overlay mark designed on a photomask as in prior technique.
Figure 3B:
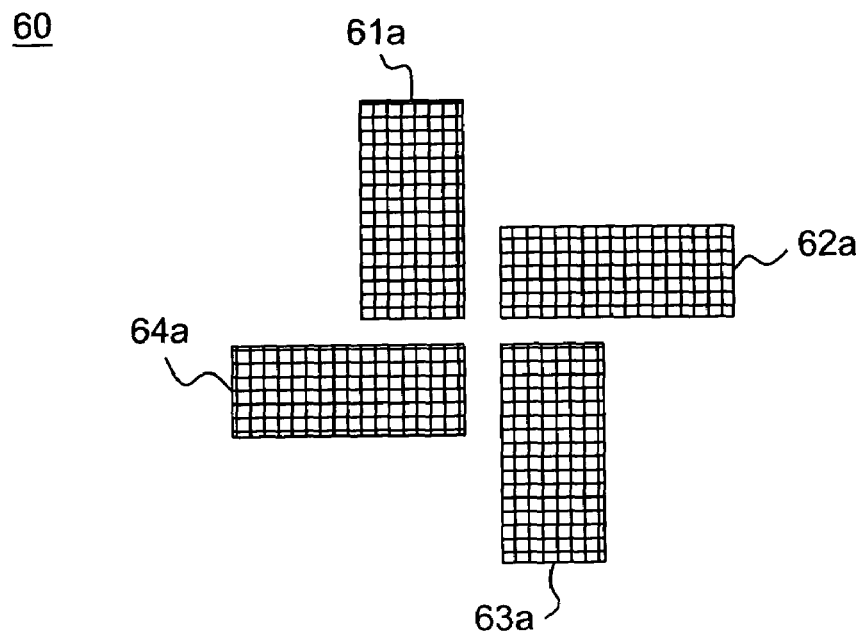
FIG. 3B illustrates an AIM aligned mark pattern formed on a substrate.
Figure 3C:
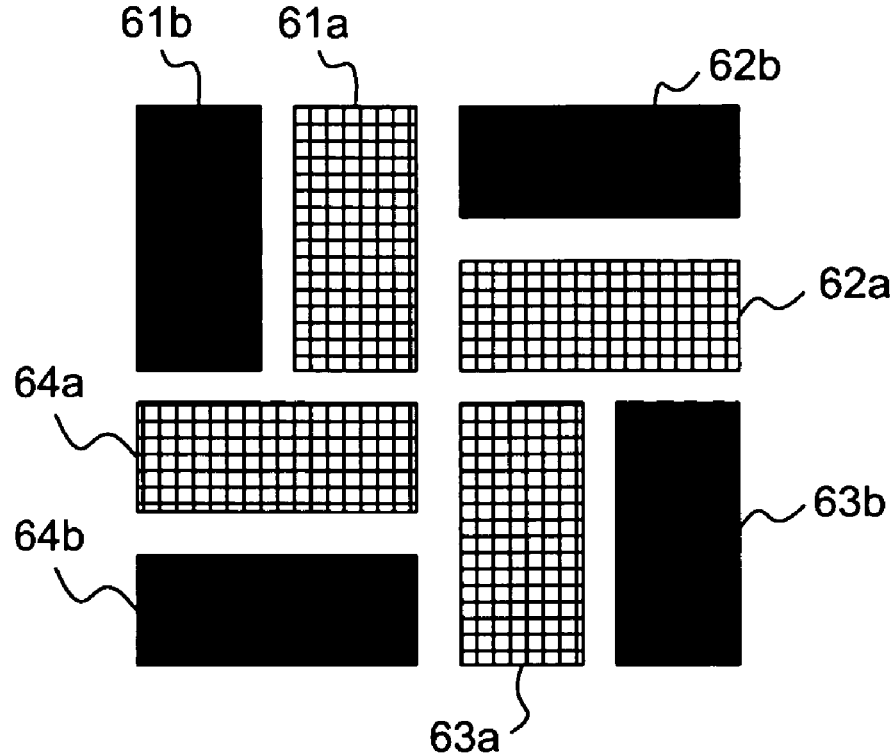
FIG. 3C illustrates an aligned structure of overlaying patterns formed by AIM overlay mark.

As indicated in FIG. 4, the embodiment discloses an AIM configuration with improved overlay mark. Similar to that disclosed in and described for FIG. 3C, this overlay configuration includes four aligned rectangular regions 81$a$, 82$a$, 83$a$ and 84$a$, and four rectangular regions 81$b$, 82$b$, 83$b$ and 84$b$. Each rectangular region has plurality of first pattern element 85 distributed evenly in each rectangular region. In addition, as indicated in FIG. 4, both the second aligned rectangular region 82$a$ and the fourth aligned rectangular region 84$a$ on x-orientation have plurality of second pattern element 86 distributed evenly therein; both the first aligned rectangular region 81$a$ and the third aligned rectangular region 83$a$ on y-orientation have plurality of third pattern element 87 distributed evenly therein. When transferred on the wafer, these pattern elements may form trenches or voids on corresponding layers of the wafer. Wherein, the second and the third pattern elements are different from each other.

In IC manufacturing process, to transfer the device patterns more precisely and to avoid the inaccuracy on orientations when transferring, using the predetermined measured distance on both horizontal and vertical orientations for alignment is required. In an embodiment of the present invention, an overlay mark includes different pattern elements on x-orientation and y-orientation respectively for the more accurate alignment on both orientations. It is noted that even the AIM overlay mark on the layer of wafer may be eroded after processes including etching, CMP or ion implant such that alignment procedure can not be performed accurately. However, in the overlay mark of the present invention, when the second pattern element 86 on x-orientation was damaged, the third pattern element 87 on y-orientation may be used to align. Likewise, when the third pattern element 87 on y-orientation was damaged, the second pattern element 86 on x-orientation may be used to align.

FIG. 5A is the cross-section view of an overlay configuration 90 on x-orientation when implemented on the wafer. In the figure, the first trench 95 is formed on the substrate 93 corresponding to the pattern elements 86 of the overlay mark in FIG. 4. In succession, a priming step on the substrate 93 is performed for enhancing adhesive capability between the photo-resist and the substrate 93. This priming step involves usage of Hexamethyldisilazane (HMDS) layer 92. Afterwards, the photo-resist 91 is coated and the overlay mark on the succeeding photomask is transferred to the photo-resist 91 as the second mark pattern 94. The measured distance $d_1$ provided by the first trench 95 and the mark pattern 94 can be used to perform the alignment procedure on x-orientation.

In another aspect, FIG. 5B is the cross-section view of an overlay configuration 90 on y-orientation when implemented on the wafer. In the figure, the second trench 95 is formed on the substrate 93 corresponding to the pattern elements 87 of the overlay mark in FIG. 4. In succession, a priming step on the substrate 93 is performed for enhancing adhesive capability between the photo-resist and the substrate 93. This priming step involves usage of Hexamethyldisilazane (HMDS) layer 92. Afterwards, the photo-resist 91 is coated and the overlay mark on the succeeding photomask is transferred to the photo-resist 91 as the third mark pattern 101. The measured distance $d_2$ provided by the second trench 102 and the mark pattern 101 can be used to perform the alignment procedure on y-orientation.

However, if the first trench 95 on x-orientation is damaged for whatever reasons disallowing role of alignment, the measured distance $d_2$ provided by the second trench 102 on y-orientation and the third mark pattern 101 then can be used as a backup for alignment procedure.

By means of the detailed descriptions of what is presently considered to be the most practical and preferred embodiments of the subject invention, it is expected that the features and the gist thereof be clearly described. Nevertheless, these embodiments are not intended to be construed in a limiting sense. Instead, it will be well understood that any analogous variations and equivalent arrangements will fall within the spirit and scope of the invention.

What is claimed is:

1. An overlay mark formed on a photomask, the overlay mark comprising:

a first rectangular region, a second rectangular region adjacent to the first rectangular region, a third rectangular region diagonal relative to the first rectangular region and adjacent to the second rectangular region, and a fourth rectangular region diagonal relative to the second rectangular region and adjacent to both the first rectangular region and the third rectangular region, wherein the first rectangular region is parallel to the third rectangular region, of and the second rectangular region is perpendicular to the first rectangular region and parallel to the fourth rectangular region, the first rectangular region and the third rectangular region respectively have a first pattern thereon, and the second rectangular region and the fourth region respectively have thereon a second pattern which is distinct from the first pattern.

* * * * *